United States Patent
Ogawa et al.

(10) Patent No.: US 9,330,807 B2
(45) Date of Patent: *May 3, 2016

(54) CONDUCTIVE PASTE AND METHOD FOR MANUFACTURING THE SAME, WIRING USING THE CONDUCTIVE PASTE AND METHOD FOR MANUFACTURING THE SAME

(71) Applicant: Empire Technology Development LLC, Wilmington, DE (US)

(72) Inventors: Kazufumi Ogawa, Awa (JP); Kazuhiro Soejima, Tokyo (JP)

(73) Assignee: EMPIRE TECHNOLOGY DEVELOPMENT LLC, Wilmington, DE (US)

( * ) Notice: Subject to any disclaimer, the term of this patent is extended or adjusted under 35 U.S.C. 154(b) by 181 days.

This patent is subject to a terminal disclaimer.

(21) Appl. No.: 14/088,737

(22) Filed: Nov. 25, 2013

(65) Prior Publication Data

US 2014/0077137 A1 Mar. 20, 2014

Related U.S. Application Data

(62) Division of application No. 12/665,027, filed as application No. PCT/JP2007/066314 on Aug. 16, 2007, now Pat. No. 8,623,500.

(51) Int. Cl.
*H05K 1/09* (2006.01)
*H01B 1/12* (2006.01)
(Continued)

(52) U.S. Cl.
CPC .. *H01B 1/12* (2013.01); *C09C 1/62* (2013.01); *C09C 3/08* (2013.01); *C09C 3/12* (2013.01);
(Continued)

(58) Field of Classification Search
CPC ........... G03F 7/025; G03F 7/075; C09C 1/62; C09C 3/08; C09C 3/12; Y10T 428/25; Y10T 428/29
See application file for complete search history.

(56) References Cited

U.S. PATENT DOCUMENTS

| 4,985,273 A | 1/1991 | Mino |
| 6,797,772 B2 | 9/2004 | Nakayoshi et al. |
| 2002/0142163 A1 | 10/2002 | Mino et al. |

FOREIGN PATENT DOCUMENTS

| JP | H07-109501 A | 4/1995 |
| JP | H08259847 A | 10/1996 |

(Continued)

OTHER PUBLICATIONS

Final Office Action for U.S. Appl. No. 12/665,027, mailed on Aug. 5, 2013, 7 pp.

(Continued)

*Primary Examiner* — Elizabeth A Robinson
(74) *Attorney, Agent, or Firm* — Foley & Lardner LLP

(57) ABSTRACT

The present invention relates to a conductive paste in which fine metal particles are dispersed into a chemical adsorption liquid produced from a mixture of at least an alkoxysilane compound, a silanol condensation catalyst, and a nonaqueous organic solvent to form an organic thin film comprising molecules covalently bound to the surface of the fine metal particle by having the surface of the fine metal particle react with the alkoxysilane compound, so that fine metal particles that are given a reactive function to the surface are produced while almost maintaining the original conductivity of the fine metal particles, and further the particles are pasted with an organic solvent.

15 Claims, 2 Drawing Sheets

WHERE ⊖ REPRESENTS THE BONDS OF —(CH$_2$)CHCH$_2$—NHCH$_2$—
                                              |
                                              OH

(51) Int. Cl.
   *C09C 1/62*    (2006.01)
   *C09C 3/08*    (2006.01)
   *C09C 3/12*    (2006.01)

(52) U.S. Cl.
   CPC ............... *H05K 1/095* (2013.01); *H05K 1/097* (2013.01); *C01P 2006/40* (2013.01); *H05K 2201/0224* (2013.01); *H05K 2201/0239* (2013.01); *Y10T 428/25* (2015.01); *Y10T 428/29* (2015.01); *Y10T 428/2991* (2015.01); *Y10T 428/2995* (2015.01); *Y10T 428/2998* (2015.01)

(56) References Cited

FOREIGN PATENT DOCUMENTS

| | | |
|---|---|---|
| JP | 2638911 B2 | 8/1997 |
| JP | 2003-064332 | 3/2003 |
| JP | 2004-356053 A | 12/2004 |
| JP | 3597507 B2 | 12/2004 |
| JP | 2005-213626 | 8/2005 |
| JP | 2007-117827 A | 5/2007 |
| JP | 2007-117828 A | 5/2007 |
| JP | 2007-118276 A | 5/2007 |
| JP | 2007-220463 A | 8/2007 |
| WO | WO 2007/007518 | 1/2007 |

OTHER PUBLICATIONS

Final Office Action for U.S. Appl. No. 12/665,027, mailed on Oct. 10, 2012, 7 pp.
International Preliminary Report on Patentability for Intl. Pat. Appln. No. PCT/JP2007/066314, issued on Feb. 16, 2010, 7 pp.
International Search Report and Written Opinion for International Patent Application No. PCT/JP2007/066314, mailed Dec. 25, 2007, 14 pages.
Non-Final Office Action for U.S. Appl. No. 12/665,027, mailed on Apr. 13, 2012, 8 pp.
Non-Final Office Action for U.S. Appl. No. 12/665,027, mailed on Feb. 26, 2013, 9 pp.
Notice of Allowance for U.S. Appl. No. 12/665,027, mailed on Sep. 23, 2013, 9 pp.
Park, S-Y., et al., "Surface Modification of Ag Coated Cu Conductive Metal Powder for Conductive Silicone Sealant Gasket Paste," *Materials Science Forum*, 2007, vol. 534-536, Trans Tech Publications, pp. 933-936.
Restriction Requirement for U.S. Appl. No. 12/665,027, mailed on Mar. 19, 2012, 8 pp.

WHERE ⊖ REPRESENTS THE BONDS OF —(CH$_2$)CHCH$_2$—NHCH$_2$—
                                              |
                                              OH

CONDUCTIVE PASTE AND METHOD FOR MANUFACTURING THE SAME, WIRING USING THE CONDUCTIVE PASTE AND METHOD FOR MANUFACTURING THE SAME

CROSS-REFERENCE TO RELATED PATENT APPLICATIONS

The present application is a divisional application under 35 U.S.C. §121 of U.S. patent application Ser. No.12/665,027, filed on Dec. 16, 2009, now U.S. Pat. No. 8,623,500, which is a national stage application under 35 U.S.C. §371 of International Application No. PCT/JP2007/066314 filed on Aug. 16, 2007, the entire contents of both of which are incorporated herein by reference in their entireties.

BACKGROUND OF THE INVENTION

1. Field of the Invention

The present invention is related to a conductive paste and the method for manufacturing the same, and a wiring using the conductive paste and the method for manufacturing the same. In particular, it relates to a conductive paste using conductive fine particles, which are given either thermal reactivity or light reactivity, or otherwise radical reactivity or ionic reactivity to the surface of fine metal particles, and the method for manufacturing the same, and also relates to a wiring using such conductive paste and the method of manufacturing the same, and further relates to electronic components and electronic equipment thereof.

In the present invention, tine metal particle includes fine metal particles made of gold, silver, copper, and nickel, or silver-plated precious metal, copper, and nickel. In addition, it includes conductive fine metal oxide particles, such as ITO and $SnO_2$.

2. Description of Related Art

In the electronics industry, a number of wirings in which a conductive paste, such as a gold paste or silver paste, is applied and sintered have been traditionally used.

However, the traditional wirings where a conductive paste containing a binder was sintered could not obtain a high conductivity unless it was sintered at a high temperature. In addition, if it needs to be sintered at a high temperature, the base material is limited to a heat-resistant base material. Furthermore, since the wiring is not bound to the surface of the base material, there is a problem in the resistance to exfoliation. For example, a related patent is listed as a reference below.

[Patent document 1] Japanese Patent Laid-Open No. 2004-356053

The present invention aims to provide a conductive paste and wirings thereof, which allow to lower the sintering temperature of the conductive paste compared to the conventional sintered wirings and offer an excellent adhesiveness to the base material allowing the formation of the wirings with a higher conductivity by hardening without a binder while the wirings are made of a hardened conductive paste.

SUMMARY OF THE INVENTION

The first aspect of this invention, which is presented in order to solve the above described problems, is a conductive paste comprising fine metal particles that are covered by an organic thin film covalently bound to the surface.

The second aspect of this invention is the conductive paste of the first aspect of this invention in which the organic thin film covalently bound to the surface comprises molecules that include a functional group at one end and covalently bind to the surface of the fine metal particle via Si or S at the other end.

The third aspect of this invention is the conductive paste of the second aspect of this invention in which the functional group is a reactive functional group.

The fourth aspect of this invention is the conductive paste of the third aspect of this invention in which the reactive functional group is a functional group with either thermal reactivity or light reactivity, or otherwise radical reactivity or ionic reactivity.

The fifth aspect of this invention is the conductive paste of the third aspect of this invention in which the reactive functional group is either an epoxy group or imino group, or otherwise a chalcone group.

The sixth aspect of this invention is the conductive paste of the first and second aspects of this invention in which the organic thin film covalently bound to the surface comprises a monomolecular film.

The seventh aspect of this invention is a method for manufacturing a conductive paste comprising a process of having the surface of the fine metal particle react with an alkoxysilane compound by dispersing the fine metal particles among a chemical adsorption liquid produced from a mixture of at least the alkoxysilane compound, a silanol condensation catalyst, and a nonaqueous organic solvent.

The eighth aspect of this invention is the method for manufacturing a conductive paste of the seventh aspect of this invention comprising the process of having the surface of the conductive paste react with an alkoxysilane compound by dispersing the fine metal particles among a chemical adsorption liquid and then cleaning the surface of the fine metal particle with an organic solvent to form a monomolecular film covalently bound to the surface of the fine metal particle.

The ninth aspect of this invention is the method for manufacturing a conductive paste of the seventh aspect of this invention in which a ketimine compound, organic acid, aldimine compound, enamine compound, oxazolidine compound, or an aminoalkylalkoxysilane compound is used instead of the silanol condensation catalyst.

The tenth aspect of this invention is the method for manufacturing a conductive paste of the seventh aspect of this invention in which at least one promoter chosen from a ketimine compound, organic acid, aldimine compound, enamine compound, oxazolidine compound, or an aminoalkylalkoxysilane compound is mixed with the silanol condensation catalyst for use.

The eleventh aspect of this invention is a wiring in which fine metal particles covered by a first organic thin film covalently bound to the surface and fine metal particles covered by a second organic thin film covalently bound to the surface are mixed to be hardened into a form by a covalent bond with each other via the foregoing organic thin films.

The twelfth aspect of this invention is the wiring of the eleventh aspect of this invention in which the first and second organic thin films covalently bound to the respective surfaces comprise molecules that include a reactive functional group at one end and covalently bind to the surface of the conductive fine metal particle via Si or S at the other end.

The thirteenth aspect of this invention is the wiring of the twelfth aspect of this invention in which the reactive functional group is a functional group with either thermal reactivity or light reactivity, or otherwise radical reactivity or ionic reactivity.

The fourteenth aspect of this invention is the wiring of the twelfth aspect of this invention in which the reactive functional group is either an epoxy group or imino group, or otherwise a chalcone group.

The fifteenth aspect of this invention is the wirings of the eleventh and twelfth aspects of this invention in which the organic thin film covalently bound to the surface comprises a monomolecular film.

The sixteenth aspect of this invention is the wirings of the eleventh through fifteenth aspects of this invention, inclusive, in which the surface of a base material covered by an organic thin film containing a first or a second reactive functional group covalently bound to the surface, and the mixture of the fine metal particles covered by the first organic thin film covalently bound to the surface and the fine metal particles covered by the second organic thin film covalently bound to the surface are covalently bound with each other via the foregoing organic thin films, respectively, to be hardened into a form.

The seventeenth aspect of this invention is a method for manufacturing a wiring comprising: a process of forming a paste by mixing in an organic solvent to the fine metal particles covered by an organic film containing the first reactive functional group covalently bound to the surface and the fine metal particles covered by an organic film containing the second reactive functional group covalently bound to the surface; a process of applying to the surface of the base material; and a process of hardening.

The eighteenth aspect of this invention is the method for manufacturing a wiring of the seventeenth aspect of this invention in which prior to the application of the paste to the base material, an organic thin film containing a functional group that reacts with the first or second reactive functional group on the surface of the fine metal particle covered by the organic film containing the first reactive functional group or of the fine metal particle covered by the organic film containing the second reactive functional group is bound to the surface of the base material.

The nineteenth aspect of this invention is an electronic component in which the conductive pastes of the first through sixth aspects of this invention, inclusive, and the wirings of the tenth through fifteenth inventions, inclusive, are used.

The twentieth aspect of this invention is electronic equipment in which the conductive pastes of the first through sixth aspects of this invention, inclusive, and the wirings of the tenth through fifteenth aspects of this invention, inclusive, are used.

The gist of the present invention is further explained hereinafter.

The gist of the present invention provides a conductive paste in which fine metal particles are dispersed into a chemical adsorption liquid produced from a mixture of at least an alkoxysilane compound, a silanol condensation catalyst, and a nonaqueous organic solvent to form an organic thin film comprising molecules covalently bound to the surface of the fine metal particle by having the surface of the fine metal particle react with the alkoxysilane compound, so that fine metal particles that are given a reactive function to the surface are produced while almost maintaining the original conductivity of the fine metal particles, and further the particles are pasted with an organic solvent.

In addition, the gist of the present invention provides a conductive paste in which after a process of having the surface of the fine metal particle react with an alkoxysilane compound by dispersing the fine metal particles among a chemical adsorption liquid, the fine metal particles that are given a reactive function are pasted with an organic solvent while almost maintaining the original shape and conductivity of the fine metal particles by cleaning the surface of the fine metal particles with an organic solvent to cover with a monomolecular film covalently bound to the surface of the fine metal particles.

In so doing, a ketimine compound, organic acid, aldimine compound, enamine compound, oxazolidine compound, or an aminoalkylalkoxysilane compound can be used instead of the silanol condensation catalyst; however, if at least one promoter chosen from a ketimine compound, organic acid, aldimine compound, enamine compound, oxazolidine compound, or an aminoalkylalkoxysilane compound is mixed with the silanol condensation catalyst, it advantageously allows a reduction of the reaction time.

In addition, if the organic thin film covalently bound to the surface comprises molecules that contain a functional group with either thermal reactivity or light reactivity, or otherwise radical reactivity or ionic reactivity, such as an epoxy group, imino group, or a chalcone group, at one end and covalently bind to the surface of the fine metal particle via Si or S at the other end, it is advantageous for quickly hardening the conductive paste.

In addition, if the organic thin film covalently bound to the surface comprises a monomolecular film, it is advantageous to increase the density of the conductive paste when hardening.

Furthermore, the gist of the present invention provides a wiring in which the fine metal particles covered by the first organic thin film covalently bound to the surface and the fine metal particles covered by the second organic thin film covalently bound to the surface are mixed to be hardened into a form by a covalent bond via the foregoing organic thin films with each other through a process of forming a paste by mixing in an organic solvent to the fine metal particles covered by the organic film containing the first reactive functional group covalently bound to the surface and the fine metal particles covered by the organic film containing the second reactive functional group covalently bound to the surface; a process of applying to the surface of the base material; and a process of hardening.

In so doing, if the first and second organic thin films covalently bound to the respective surfaces comprise molecules that include a reactive functional group at one end and covalently bind to the surface of the conductive fine metal particle via Si or S at the other end, it is advantageous to directly give a reactivity to the fine metal particle.

In addition, if the reactive functional group is a functional group with either thermal reactivity or light reactivity, or otherwise radical reactivity or ionic reactivity, it is advantageous for performing a thermal solidification or photo-setting of the paste.

Furthermore, if the reactive functional group is an epoxy group or imino group with thermal reactivity, or otherwise a chalcone group with light reactivity, it advantageously allows for a lowering of the curing temperature.

Furthermore, if the organic thin film covalently bound to the surface comprises a monomolecular film, it is advantageous to improve the conductivity of the wiring.

Prior to the application of the paste to the base material, if an organic thin film containing a functional group that reacts with the first or second reactive functional group on the surface of the fine metal particle covered by the organic film containing the first reactive functional group or of the fine metal particle covered by the organic film containing the second reactive functional group is bound to the surface of the base material, the first or second reactive functional group on the surface of the fine metal particles reacts with the functional group that reacts with the first or second reactive functional group on the surface of the base material to covalently bind the fine metal particles to the surface of the base material via the foregoing respective organic thin films; therefore, it is advantageous to improve the adhesion performance of the wiring to the base material.

According to the present invention, it has the particular effect of providing a wiring of a hardened conductive paste with a lower resistance compared to the traditional sintered wirings, while the wiring is made of a hardened conductive paste. It also has the effect of improving the resistance to exfoliation.

BRIEF DESCRIPTION OF THE DRAWINGS

FIG. 1 is a conceptual diagram of Example 1 of the present invention that enlarges the reaction of the fine silver particle to the molecular level.

DETAILED DESCRIPTION

Figure 1A:
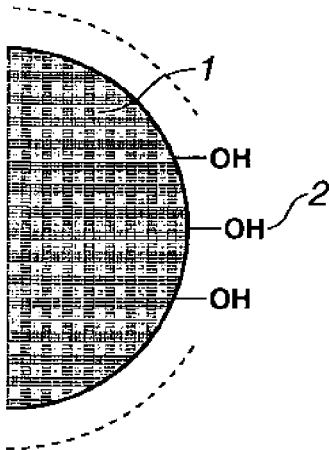
FIG. 1A shows the surface of the fine silver particle before the reaction.

The present invention provides a high performance conductive paste through processes where at least the fine metal particles are dispersed into a chemical adsorption liquid produced from a mixture of an alkoxysilane compound, a silanol condensation catalyst, and a nonaqueous organic solvent to have the surface of the fine metal particles react with the alkoxysilane compound, and then the surface of the fine metal particles is cleaned with an organic solvent to produce fine metal particles that are given a reactive function to the surface while almost completely maintaining the original conductivity of the fine metal particles, and further forming a paste by mixing in an organic solvent to the fine metal particles covered by the organic film containing the first reactive functional group covalently bound to the surface and the fine metal particles covered by the organic film containing the second reactive functional group covalently bound to the surface.

Furthermore, the present invention provides a wiring in which fine metal particles covered by a first organic thin film covalently bound to the surface and fine metal particles covered by a second organic thin film covalently bound to the surface are mixed to be hardened into a form by a covalent bond with each other via the foregoing organic thin films through a process of applying the foregoing conductive paste to the surface of the base material, and a process of hardening.

Therefore, the present invention works to provide a conductive paste that is given reactivity to the surface of the fine metal particles themselves without using a binder while almost completely maintaining the original shape and conductivity of the fine metal particles, and further works to provide a high performance wiring, electronic components, and electronic equipment thereof in which the conductive paste is hardened into a form by using the functionality.

Although examples are hereinafter used to describe the details of the present invention, these examples shall not be construed as limiting of the present invention.

The fine metal particles according to the present invention include fine particles made of gold, silver, copper, nickel, or silver-plated precious metal, copper, and nickel. First, the fine silver particle is used to explain the representative example.

EXAMPLE 1

First, an anhydrous fine silver particle 1 with a particle diameter of about 500 nm was prepared and dried thoroughly. Next, as a chemical adsorption agent, an agent containing a reactive functional group (e.g., epoxy group or imino group) at the functional site and an alkoxysilyl group at the other end, for example the agent shown in the following chemical formula [Formula 1] or [Formula 2], was measured to be 99 with %, and as a silanol condensation catalyst, for example, dibutyltin diacetylacetonate or acetic acid (a type of organic acid) was measured to be 1 with %, respectively. These were dissolved into a silicone solvent (e.g., a mixed solvent with 50% of hexamethyldisiloxane and 50% of dimethylformamide) to prepare a chemical adsorption liquid so that it had a concentration of about 1 with % (preferably, the concentration of the chemical adsorption agent is about 0.5 to 3%).

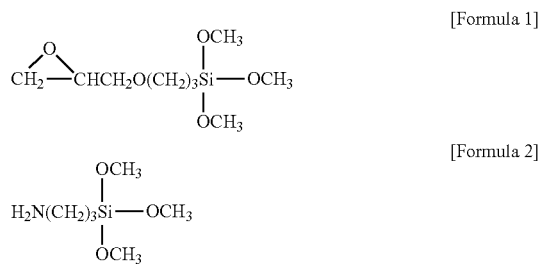

Figure 1B:
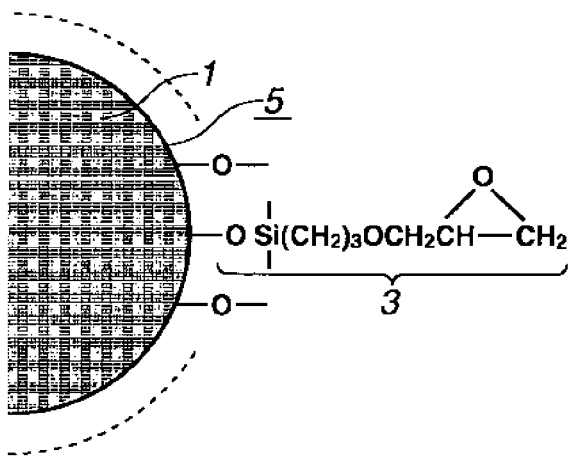
FIG. 1B shows the surface after a monomolecular film containing an epoxy group is formed.
Figure 1C:
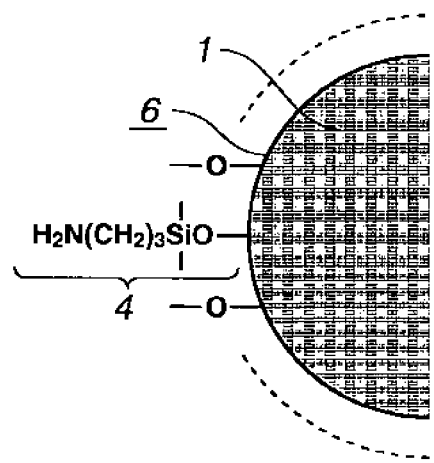
FIG. 1C shows the surface after a monomolecular film containing an amino group is formed.

The anhydrous fine silver particles were mixed and stirred in this adsorption liquid and reacted in a normal atmosphere (45% relative humidity) for two hours. In this case, since the surface of the anhydrous fine silver particle is bound with a lot of hydroxyl groups 2 (shown in FIG. 1A), a chemical adsorption monomolecular film 3 containing epoxy groups, or a chemical adsorption film 4 containing amino groups, which forms a chemical bond with the surface of the fine silver particle throughout the surface, was formed at a thickness of about 1 nm because of the bonding formation shown in the following chemical formula [Formula 3] or [Formula 4] by a dealcoholization reaction (in this case, de-$CH_3OH$) between the $Si(OCH_3)$ group of the foregoing chemical adsorption agent and the foregoing hydroxyl groups under the presence of the silanol condensation catalyst or acetic acid, a type of organic acid (shown in FIGS. 1B and 1C).

When using an adsorption agent containing an amino group, it was better to use an organic acid, such as acetic acid, since the tintype catalyst produced a deposition. Although the amino group contains an imino group, substances such as pyrrole derivative and imidazole derivatives other than the amino group also contain the imino group. Furthermore, when a ketimine derivative was used, the amino group was easily introduced by hydrolysis after the coating formation.

Then, a chlorinated solvent was added to the mixture and stirred for cleaning (chloroform was used in this example), and thus, fine silver particles of which the surfaces were covered by a chemical adsorption monomolecular film containing a reactive functional group, for example, an epoxy group or amino group, were manufactured, respectively.

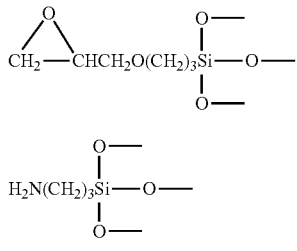
[Formula 3]

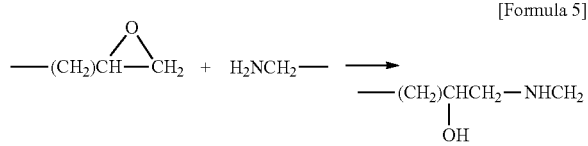
[Formula 4]

Since this processed part had an extremely thin coating with a film thickness at the nanometer level, the size and the conductivity of the fine silver particle were hardly impaired.

When it was removed from the atmosphere without cleaning, the reactivity was almost the same; however, the solvent evaporated and the chemical adsorption agent left behind on the surface of the fine silver particle reacted at the surface of the fine silver particle with the moisture in the atmosphere, and a fine silver particle was then obtained on which an extremely thin polymer coating was formed from the foregoing chemical adsorption agent on the surface of the fine silver particle.

Since this method has a feature of using a dealcoholization reaction, it is applicable to a substance, such as fine silver particles, which can be damaged by an acid.

Then, the same amount of fine silver particles 5 and 6 covered by the chemical adsorption monomolecular film with the foregoing epoxy group or amino group were sampled, respectively, and mixed well in an isopropyl alcohol to form a paste. When the paste was applied to the surface of a base material in a pattern with a screen printing machine and heated at 50 to 100 degrees Celsius (in the case of a functional group with light reactivity, the solvent shall be evaporated and then shall be irradiated by a light), the isopropyl alcohol was evaporated, and the epoxy group and amino group were added by the reaction shown in the following chemical formula [Formula 5] to bind and solidify the fine silver particles, allowing to form a conductor wiring with the conductivity of $0.2 \times 10^6$ Siemens.

[Formula 5]

—(CH$_2$)CH—CH$_2$ + H$_2$NCH$_2$— → —(CH$_2$)CHCH$_2$—NHCH$_2$
                                              |
                                             OH

EXAMPLE 2

Figure 2:
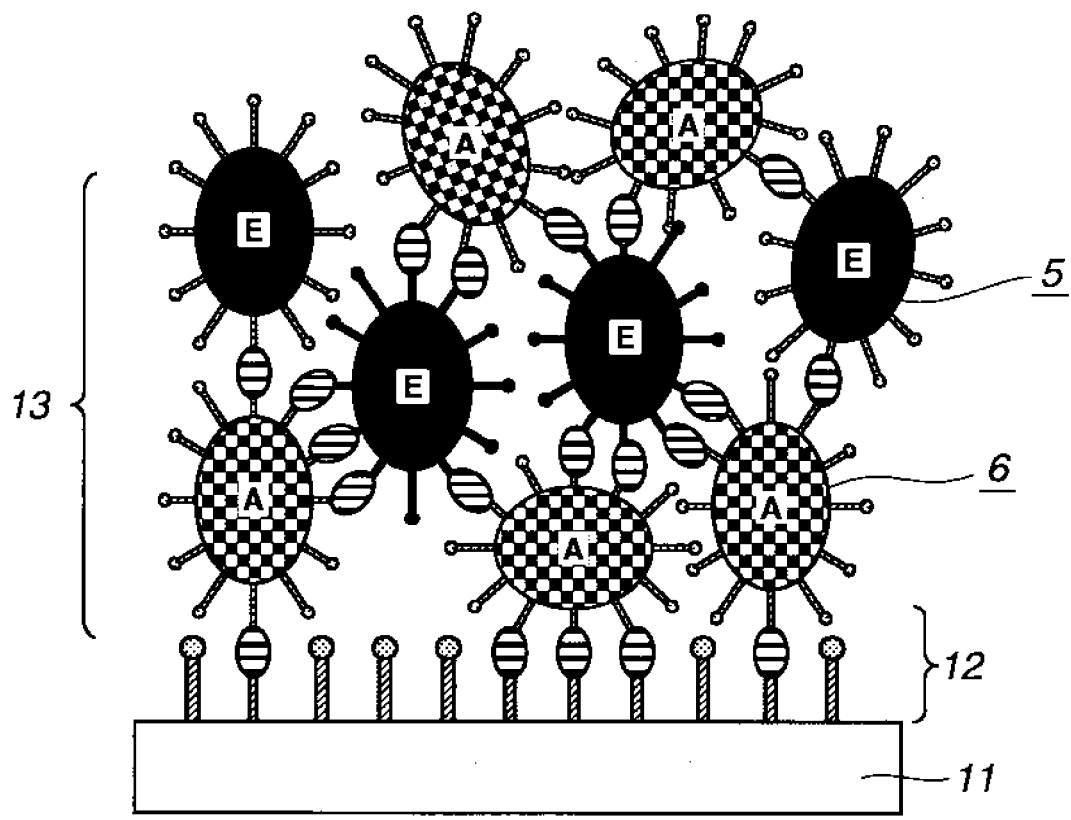
FIG. 2 is a conceptual diagram of Example 2 of the present invention that enlarges the wiring to the fine silver particle level. It shows the surface after heating and hardening of a base material where a mixture of almost the same amount of fine silver particles E on which a monomolecular film containing an epoxy group was formed and fine silver particles A on which a monomolecular film containing an amino group was formed, was applied by printing to the surface of the base material on which a monomolecular film containing an epoxy group was formed.

In Example 1, if an organic thin film 12 with a reactive functional group (e.g., epoxy group) was also formed on the surface of the base material 11 in the same method prior to the printing application of the foregoing conductive paste followed by heating and hardening, a part of the organic thin film on the surface of the fine silver particles (e.g., where covered by an amino group) forms a covalent bond by a reaction also with the organic thin film on the surface of the base material as shown in FIG. 2, allowing to manufacture an electrode wiring 13 with a high resistance to exfoliation.

Although the above Example 1 used the substance shown in [Formula 1] or [Formula 2] as a chemical adsorption agent containing a reactive group, the following substances (1) through (16), inclusive, other than those described above could also be used:

| | |
|---|---|
| (CH$_2$OCH)CH$_2$—O—(CH$_2$)$_7$Si(OCH$_3$)$_3$ | (1) |
| (CH$_2$OCH)CH$_2$—O—(CH$_2$)$_{11}$Si(OCH$_3$)$_3$ | (2) |
| (CH$_2$CHOCH(CH$_2$)$_2$)CH(CH$_2$)$_2$Si(OCH$_3$)$_3$ | (3) |
| (CH$_2$CHOCH(CH$_2$)$_2$)CH(CH$_2$)$_4$Si(OCH$_3$)$_3$ | (4) |
| (CH$_2$CHOCH(CH$_2$)$_2$)CH(CH$_2$)$_6$Si(OCH$_3$)$_3$ | (5) |
| (CH$_2$OCH)CH$_2$—O—(CH$_2$)$_7$Si(OC$_2$H$_5$)$_3$ | (6) |
| (CH$_2$OCH)CH$_2$—O—(CH$_2$)$_{11}$Si(OC$_2$H$_5$)$_3$ | (7) |
| (CH$_2$CHOCH(CH$_2$)$_2$)CH(CH$_2$)$_2$Si(OC$_2$H$_5$)$_3$ | (8) |
| (CH$_2$CHOCH(CH$_2$)$_2$)CH(CH$_2$)$_4$Si(CH$_2$H$_5$)$_3$ | (9) |
| (CH$_2$CHOCH(CH$_2$)$_2$)CH(CH$_2$)$_6$Si(OC$_2$H$_5$)$_3$ | (10) |
| H$_2$N(CH$_2$)$_5$Si(OCH$_3$)$_3$ | (11) |
| H$_2$N(CH$_2$)$_7$Si(OCH$_3$)$_3$ | (12) |
| H$_2$N(CH$_2$)$_9$Si(OCH$_3$)$_3$ | (13) |
| H$_2$N(CH$_2$)$_5$Si(OC$_2$H$_5$)$_3$ | (14) |
| H$_2$N(CH$_2$)$_7$Si(OC$_2$H$_5$)$_3$ | (15) |
| H$_2$N(CH$_2$)$_9$Si(OC$_2$H$_5$)$_3$ | (16) |

Hereinabove, the (CH$_2$OCH) group represents a functional group shown in the following formula [Formula 6], and the (CH$_2$CHOCH(CH$_2$)$_2$)CH group represents a functional group shown in the following formula [Formula 7].

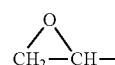
[Formula 6]

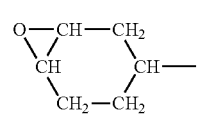
[Formula 7]

In addition, the above example used a chemical adsorption agent containing a group with thermal reactivity or ionic reactivity, and the following substances (21) through (29), inclusive, could also be used as those with light reactivity:

| | |
|---|---|
| CH≡C—C≡C(CH$_2$)$_{15}$SiCl$_3$ | (21) |
| CH≡C—C≡C(CH$_2$)$_2$Si(CH$_3$)$_2$(CH$_2$)$_{15}$SiCl$_3$ | (22) |
| CH≡C—C≡C(CH$_2$)$_2$Si(CH$_3$)$_2$(CH$_2$)$_9$SiCl$_3$ | (23) |
| CH$_3$(CH$_2$)$_3$C≡C—C≡C(CH$_2$)$_{15}$SiCl$_3$ | (24) |
| CH$_3$(CH$_2$)$_3$C≡C—C≡C(CH$_2$)$_2$Si(CH$_3$)$_2$(CH$_2$)$_{15}$SiCl$_3$ | (25) |
| CH$_3$(CH$_2$)$_3$C≡C—C≡C(CH$_2$)$_2$Si(CH$_3$)$_2$(CH$_2$)$_9$SiCl$_3$ | (26) |
| (C$_6$H$_5$)(CH)$_2$CO(C$_6$H$_4$)O(CH$_2$)$_6$OSi(OCH$_3$)$_3$ | (27) |

Where $(C_6H_5)(CH)_2CO(C_6H_4)$— and $(C_6H_5)CO(CH)_2(C_6H_4)$— represent chalcone groups.

In addition, in the case that the material of the fine particle is made of Au, although it does not have a hydroxyl group on the surface, when an agent in which the $SiCl_3$ group or $Si(OCH_3)_3$ at the terminal position was replaced with the SH group, or a triazinethiol group was used as a chemical adsorption agent (e.g., $H_2N(CH_2)_n$—SH (where n is a whole number)), or in particular, when $H_2N(CH_2)_{11}$—SH or a similar formula was used, a fine gold particle with a formation of a monomolecular film containing an amino group via S was manufactured. On the other hand, when an agent having the SH group and a methoxysilyl group at the respective terminal positions was used (e.g., $HS(CH_2)_mSi(OCH_3)_3$ (where m is a whole number)), or in particular, when $HS(CH_2)_3Si(OCH_3)_3$ or a similar formula was used, a fine gold particle with a formation of a monomolecular film containing a reactive methoxysilyl group on the surface via S was manufactured.

In Example 1, for the silanol condensation catalyst, groups of carboxylic acid metal salt, carboxylic acid ester metal salt, carboxylic acid metal salt polymer, carboxylic acid metal salt chelate, titanic acid ester, and titanic acid ester chelate are available. More specifically, stannous acetic acid, dibutyltin dilaurate, dibutyltin dioctate, dibutyltin diacetate, dioctyltin dilaurate, dioctyltin dioctate, dioctyltin diacetate, stannous dioctanoic acid, lead naphthenate, cobalt naphthenate, iron 2-ethylhexanoate, dioctyltin bis-octylthioglycolate ester, dioctyltin maleate ester, dibutyltin maleate polymer, dimethyltin mercaptopropionate polymer, dibutyltin bis-acetylacetate, dioctyltin bis-acetyl laurate, tetrabutyltitanate, tetranonyltitanate, and bis(acetylacetonyl)dipropyl titanate could be used.

For the film forming liquid, anhydrous organochlorine solvent, hydrocarbon solvent, fluorocarbon solvent, silicone solvent, or a mixture of these were available as a solvent. If trying to increase the silver particle concentration by evaporating the solvent without cleaning, the boiling point of the solvent is preferably between 50 and 250 degrees Celsius. In addition, if the adsorption agent is an alkoxysilane type and the organic coating is formed by evaporating the solvent, an alcohol solvent, such as methanol, ethanol, propanol, or a mixture of these, could be used in addition to the above listed solvents.

More precisely, an organochlorine solvent, nonaqueous petroleum naphtha, solvent naphtha, petroleum ether, petroleum benzine, isoparaffin, n-paraffin, decalin, industrial gasoline, nonane, decane, kerosene, dimethyl silicone, phenyl silicone, alkyl modified silicone, polyether silicone, dimethylformamide, or a mixture of these can be used.

In addition, the fluorocarbon solvent can be a chlorofluorocarbon solvent, Fluorinert (a product manufactured by 3M Company), and Aflude (a product manufactured by Asahi Glass Co., Ltd.). These may be used solely, or two or more kinds may be mixed if the combination blends well. In addition, an organochlorine solvent, such as chloroform, may be added.

On the other hand, when a ketimine compound, organic acid, aldimine compound, enamine compound, oxazolidine compound, or an aminoalkylalkoxysilane compound were used instead of the silanol condensation catalyst, the processing time was reduced to about ½ to ⅔ at the same concentration.

Moreover, when the silanol condensation catalyst was used mixing with a ketimine compound, organic acid, aldimine compound, enamine compound, oxazolidine compound, or aminoalkylalkoxysilane compound (although the ratio can vary from 1:9 to 9:1, it is normally preferable to be around 1:1), the processing time was even several times faster (to about one-half hour), so that the time of film formation was reduced to a fraction.

For example, when a dibutyltin oxide, which is a silanol catalyst, was replaced with H3 (from Japan Epoxy Resins Co., Ltd.), a ketimine compound, and the other conditions remained the same, we obtained almost the same results, except that the reaction time was reduced to about one hour.

Moreover, when the silanol catalyst was replaced with a mixture of H3 (from Japan Epoxy Resins Co., Ltd.), a ketimine compound, and dibutyltin bis-acetylacetonate, a silanol catalyst (mixing ratio of 1:1), and the other conditions remained the same, we obtained almost the same results, except that the reaction time was reduced to about one-half hour.

Therefore, the above results clearly indicated that the ketimine compound, organic acid, aldimine compound, enamine compound, oxazolidine compound, and aminoalkylalkoxysilane compound are more active than the silanol condensation catalyst.

Moreover, the activity was further enhanced when the silanol condensation catalyst was mixed with one selected from a ketimine compound, organic acid, aldimine compound, enamine compound, oxazolidine compound, and aminoalkylalkoxysilane compound.

The available ketimine compounds are not particularly limited, and include the following examples: 2,5,8-triaza-1,8-nonadien;
3,11-dimethyl-4,7,10-triaza-3,10-tridecadien;
2,10-dimethyl-3,6,9-triaza-2,9-undecadien;
2,4,12,14-tetramethyl-5,8,11-triaza-4,11-pentadecadien;
2,4,15,17-tetramethyl-5,8,11,14-tetraaza-4,14-octadecadien;
2,4,20,22-tetramethyl-5,12,19-triaza-4,19-trieicosadien; etc.

There are also no particular limitations to the organic acids available; however, for example, formic acid, acetic acid, propionic acid, butyric acid, and malonic acid showed almost the same effect.

In the above examples, fine silver particles were used for the explanation; however, any fine metal particles that contain active hydrogen, such as hydrogen of the hydroxyl group, on the surface are available as fine metal particles for the present invention, and in order to ensure the conductivity, a fine metal particle that is made of silver or covered by silver was better.

In particular, it is applicable to fine particles made of silver, copper, and nickel, or silver-plated precious metal, copper, and nickel.

What is claimed is:

1. A wiring comprising:
   first fine metal particles covered by a first organic thin film formed by reaction of the first fine metal particles with a diacetylene, the organic thin film covalently bound to a surface of the fine metal particles; and
   second fine metal particles covered by a second organic thin film covalently bound to a surface of the second fine metal particles, the second organic thin film comprising a chalcone at a first end and covalently bound to the surface of the second fine metal particles via a Si or S at a second end;
   wherein:
     the wiring comprises the hardened reaction product of the first and second organic thin films; and
     the diacetylene is $HC\equiv C-C\equiv C(CH_2)_{15}SiCl_3$;
     $HC\equiv C-C\equiv C(CH_2)_2Si(CH_3)_2(CH_2)_{15}SiCl_3$;
     $HC\equiv C-C\equiv C(CH_2)_2Si(CH_3)_2(CH_2)_9SiCl_3$;

$CH_3(CH_2)_3C{\equiv}C{-}C{\equiv}C(CH_2)_{15}SiCl_3$;
$CH_3(CH_2)_3C{\equiv}C{-}C{\equiv}C(CH_2)_2Si(CH_3)_2(CH_2)_{15}SiCl_3$; or
$CH_3(CH_2)_3C{\equiv}C{-}C{\equiv}C(CH_2)_2Si(CH_3)_2(CH_2)_9SiCl_3$.

2. The wiring of claim 1, wherein the first and second organic thin films covalently bound to the surface comprise a monomolecular film.

3. The wiring of claim 1 further comprising a base material upon which the first fine metal particle covered by the first organic thin film and the second fine metal particles covered by the second organic thin film are hardened.

4. The wiring of claim 1, wherein the first fine metal particles comprise indium tin oxide, tin oxide, gold, silver, copper, nickel, silver-plated gold, silver-plated copper, or silver-plated nickel.

5. The wiring of claim 1, wherein the second fine metal particles comprise indium tin oxide, tin oxide, gold, silver, copper, nickel, silver-plated gold, silver-plated copper, or silver-plated nickel.

6. An electronic component comprising a wiring comprising:
    first fine metal particles covered by a first organic thin film formed by reaction of the first fine metal particles with a diacetylene; and
    second fine metal particles covered by a second organic thin film covalently bound to a surface of the second fine metal particles, the second organic thin film comprising a chalcone at a first end and covalently bound to the surface of the second fine metal particles via a Si or S at a second end;
    wherein:
        the wiring comprises the hardened reaction product of the first and second organic thin films; and
        the diacetylene is $HC{\equiv}C{-}C{\equiv}C(CH_2)_{15}SiCl_3$;
        $HC{\equiv}C{-}C{\equiv}C(CH_2)_2Si(CH_3)_2(CH_2)_{15}SiCl_3$;
        $HC{\equiv}C{-}C{\equiv}C(CH_2)_2Si(CH_3)_2(CH_2)_9SiCl_3$;
        $CH_3(CH_2)_3C{\equiv}C{-}C{\equiv}C(CH_2)_{15}SiCl_3$;
        $CH_3(CH_2)_3C{\equiv}C{-}C{\equiv}C(CH_2)_2Si(CH_3)_2(CH_2)_{15}SiCl_3$; or
        $CH_3(CH_2)_3C{\equiv}C{-}C{\equiv}C(CH_2)_2Si(CH_3)_2(CH_2)_9SiCl_3$.

7. The electronic component of claim 6, wherein the first fine metal particles comprise indium tin oxide, tin oxide, gold, silver, copper, nickel, silver-plated gold, silver-plated copper, or silver-plated nickel.

8. The electronic component of claim 6, wherein the second fine metal particles comprise indium tin oxide, tin oxide, gold, silver, copper, nickel, silver-plated gold, silver-plated copper, or silver-plated nickel.

9. The electronic component of claim 6, wherein the organic thin film covalently bound to the surface comprises a monomolecular film.

10. The electronic component of claim 6 further comprising a base material upon which the first fine metal particle covered by the first organic thin film and the second fine metal particles covered by the second organic thin film are hardened.

11. An electronic device comprising a wiring comprising:
    first fine metal particles covered by a first organic thin film formed by reaction of the first fine metal particles with a diacetylene; and
    second fine metal particles covered by a second organic thin film covalently bound to a surface of the second fine metal particles, the second organic thin film comprising a chalcone at a first end and covalently bound to the surface of the second fine metal particles via a Si or S at a second end;
    wherein:
        the wiring comprises the hardened reaction product of the first and second organic thin films; and
        the diacetylene is $HC{\equiv}C{-}C{\equiv}C(CH_2)_{15}SiCl_3$;
        $HC{\equiv}C{-}C{\equiv}C(CH_2)_2Si(CH_3)_2(CH_2)_{15}SiCl_3$;
        $HC{\equiv}C{-}C{\equiv}C(CH_2)_2Si(CH_3)_2(CH_2)_9SiCl_3$;
        $CH_3(CH_2)_3C{\equiv}C{-}C{\equiv}C(CH_2)_{15}SiCl_3$;
        $CH_3(CH_2)_3C{\equiv}C{-}C{\equiv}C(CH_2)_2Si(CH_3)_2(CH_2)_{15}SiCl_3$; or
        $CH_3(CH_2)_3C{\equiv}C{-}C{\equiv}C(CH_2)_2Si(CH_3)_2(CH_2)_9SiCl_3$.

12. The electronic device of claim 11, wherein the first fine metal particles comprise indium tin oxide, tin oxide, gold, silver, copper, nickel, silver-plated gold, silver-plated copper, or silver-plated nickel.

13. The electronic device of claim 11, wherein the second fine metal particles comprise indium tin oxide, tin oxide, gold, silver, copper, nickel, silver-plated gold, silver-plated copper, or silver-plated nickel.

14. The electronic device of claim 11, wherein the organic thin film covalently bound to the surface comprises a monomolecular film.

15. The electronic device of claim 11 further comprising a base material upon which the first fine metal particle covered by the first organic thin film and the second fine metal particles covered by the second organic thin film are hardened.

* * * * *